(12) United States Patent
Ma et al.

(10) Patent No.: US 11,276,721 B2
(45) Date of Patent: Mar. 15, 2022

(54) CMOS IMAGE SENSORS WITH PER-PIXEL MICRO-LENS ARRAYS

(71) Applicant: Gigajot Technology, Inc., Pasadena, CA (US)

(72) Inventors: Jiaju Ma, Pasadena, CA (US); Michael Guidash, Fairport, NY (US)

(73) Assignee: Gigajot Technology, Inc., Pasadena, CA (US)

( * ) Notice: Subject to any disclaimer, the term of this patent is extended or adjusted under 35 U.S.C. 154(b) by 0 days.

(21) Appl. No.: 16/893,035

(22) Filed: Jun. 4, 2020

(65) Prior Publication Data
US 2020/0388643 A1     Dec. 10, 2020

Related U.S. Application Data

(60) Provisional application No. 62/859,545, filed on Jun. 10, 2019.

(51) Int. Cl.
| | |
|---|---|
| *H01L 27/00* | (2006.01) |
| *H01L 27/146* | (2006.01) |
| *H04N 9/04* | (2006.01) |
| *H04N 5/374* | (2011.01) |

(52) U.S. Cl.
CPC .... *H01L 27/14627* (2013.01); *H01L 27/1462* (2013.01); *H01L 27/1463* (2013.01); *H01L 27/14621* (2013.01); *H01L 27/14629* (2013.01); *H01L 27/14645* (2013.01); *H01L 27/14685* (2013.01); *H04N 5/374* (2013.01); *H04N 9/0455* (2018.08)

(58) Field of Classification Search
CPC ........... H01L 27/14627; H01L 27/1462; H01L 27/14621; H04N 9/0455
See application file for complete search history.

(56) References Cited

U.S. PATENT DOCUMENTS

| | | | | |
|---|---|---|---|---|
| 7,763,918 | B1 * | 7/2010 | Feng | H01L 27/14605 |
| | | | | 257/292 |
| 10,665,627 | B2 * | 5/2020 | Hsu | H01L 27/14629 |
| 10,868,070 | B2 * | 12/2020 | Jin | H01L 27/1462 |
| 2017/0330905 | A1 * | 11/2017 | Tak | H01L 27/14621 |
| 2017/0373108 | A1 * | 12/2017 | Hwangbo | H01L 27/14621 |
| 2019/0081098 | A1 * | 3/2019 | Lenchenkov | G02B 3/0056 |
| 2019/0148434 | A1 * | 5/2019 | Hsu | H01L 27/14632 |
| | | | | 257/432 |
| 2019/0296070 | A1 * | 9/2019 | Jin | H01L 27/14603 |
| 2020/0286939 | A1 * | 9/2020 | Hsu | H01L 27/14623 |
| 2020/0295069 | A1 * | 9/2020 | Sulfridge | H01L 27/14643 |

FOREIGN PATENT DOCUMENTS

JP     2009276717 A     11/2009

OTHER PUBLICATIONS

PCT/US2020/036676, International Search Report, dated Oct. 26, 2020.
PCT/US2020/036676, Written Opinion of the International Searching Authority, dated Oct. 26, 2020.

* cited by examiner

*Primary Examiner* — Mounir S Amer
*Assistant Examiner* — Alexander Belousov
(74) *Attorney, Agent, or Firm* — Charles Shemwell

(57) ABSTRACT

An image sensor includes an array of CMOS pixels and a plurality of micro-lens arrays. Each micro-lens array of the plurality of micro-lens arrays includes a plurality of horizontally adjacent micro-lenses. Each micro-lens array of the plurality of micro-lens arrays is situated above a respective CMOS pixel in the array of CMOS pixels.

16 Claims, 11 Drawing Sheets

CMOS IMAGE SENSORS WITH PER-PIXEL MICRO-LENS ARRAYS

RELATED APPLICATIONS

This application claims priority to U.S. Provisional Patent Application No. 62/859,545, filed Jun. 10, 2019, which is hereby incorporated by reference in its entirety.

TECHNICAL FIELD

This disclosure relates to image sensors, and more specifically to CMOS image sensors with per-pixel micro-lens arrays.

BACKGROUND

Complementary metal-oxide-semiconductor (CMOS) image sensors are conventionally implemented with one micro-lens for each pixel, such that the pitch (i.e., pitch size) of the micro-lens equals the pitch of the pixels. FIG. 1 is a cross-sectional view of a CMOS image-sensor pixel 100 with a single micro-lens 110 situated above it. The pixel 100 includes a photo-carrier collection region 102 in a silicon substrate 101. Photo-carriers generated by light incident on a photodiode in the pixel 100 are collected in the photo-carrier collection region 102. Circuitry in the pixel 100 generates an output signal based on the amount of charge, and thus the number of photo-carriers, collected in the photo-carrier collection region 102. The photodiode and circuitry are not shown in FIG. 1, for simplicity. In addition to the single micro-lens 110, a color filter 106 is associated with the pixel 100. The color filter 106 is situated above the pixel 100 in a metal grid 108 and is separated from the pixel 100 by passivation and anti-reflective coating (ARC) 104. The micro-lens 110 is situated above the color filter 106, such that the color filter 106 is between the micro-lens 110 and the pixel 100 (and also between the micro-lens 110 and the passivation/ARC 104).

FIG. 2 is a plan view of a plurality of micro-lenses 110 and color filters 106. The color filters 106 include green (G) filters 106-1, red (R) filters 106-2, and blue (B) filters 106-3. Each micro-lens is situated above a respective color filter 106, per FIG. 1. A pixel 100 is located beneath each micro-lens 110 and corresponding color filter 106; these pixels 100 are obscured by their associated micro-lenses 110 and corresponding color filters 106 and thus are not visible in FIG. 2. A two-dimensional (2D) array of micro-lenses 110 is thus situated above a 2D array of color filters 106, which is situated above a 2D array of pixels 100. The pixels 100, color filters 106, and micro-lenses 110 all have the same pitch. Pitch is measured from an edge of a particular structure (i.e., pixel 100, color filter 106, or micro-lens 110) to a corresponding edge of the next structure in a particular direction (e.g., along the x- or y-axis).

The conventional approach of FIGS. 1 and 2 has problems. First, there are limitations on the chief incident ray angle (i.e., the incident CRA) for large pixels. Pixels with relatively large pitch sizes (e.g., greater than 5 um) usually have a fill-factor of less than 100%. Incident light with high chief ray angles (CRAs) will not be efficiently collected by the photodiodes. This problem is primarily due to limitations in the micro-lens fabrication such as maximum thickness of the micro-lens material. With a large pixel, this maximum thickness will limit or reduce the maximum radius of curvature that can be achieved with the micro-lens. The reduced radius of curvature of the micro-lens will limit the ability of the micro-lens to maintain light rays with large ray angles within the pixel. FIG. 3, which shows the same cross-sectional view as FIG. 1, illustrates this problem. Incident light with low chief ray angles, such as the light ray 300 (shown with an approximately zero CRA), intersects with the photo-carrier collection region 102 and thus is absorbed by the photodiode, generating photo-carriers that are collected in the photo-carrier collection region 102. Light rays 302 and 304, however, which have high chief ray angles, may not be collected in the photo-carrier collection region 102. For example, the light rays 302 and 304 may not be absorbed by the photodiode associated with the color filter 106 and micro-lens 110 through which the light rays 302 and 304 have passed (i.e., the photodiode of the pixel 100 of FIG. 1). Or the light rays 302 and 304 may be absorbed in the photodiode of the pixel 100 of FIG. 1, but the resulting photo-carriers may not be collected in the photo-carrier collection region 102 (e.g., may be collected in the photo-carrier collection region 102 of an adjacent pixel). The light rays 302 and 304 thus are not detected by the pixel 100 on which they are incident.

Optical cross-talk is also a problem with this conventional approach. Incident light with high chief ray angles (e.g., light rays 302 and 304, FIG. 3) will get into neighboring pixels and cause optical cross-talk. The optical cross-talk will lead to an increase in color noise, because adjacent pixels 100 have different-colored filters 106 (as shown in FIG. 2), and a reduction of the modulation transfer function.

SUMMARY

Accordingly, there is a need for improved micro-lens systems for pixels in CMOS image sensors.

In some embodiments, an image sensor includes an array of CMOS pixels and a plurality of micro-lens arrays. Each micro-lens array of the plurality of micro-lens arrays includes a plurality of horizontally adjacent micro-lenses. Each micro-lens array of the plurality of micro-lens arrays is situated above a respective CMOS pixel in the array of CMOS pixels.

In some embodiments, a method of fabricating an image sensor includes fabricating an array of CMOS pixels and fabricating a plurality of micro-lens arrays situated above respective CMOS pixels in the array of CMOS pixels. Fabricating the plurality of micro-lens arrays includes, for each micro-lens array of the plurality of micro-lens arrays, fabricating a plurality of horizontally adjacent micro-lenses situated above a respective CMOS pixel in the array of CMOS pixels.

Micro-lens arrays as disclosed herein mitigate limitations on the chief incident ray angle, reduce optical cross-talk, and improve optical collection in CMOS image sensors.

BRIEF DESCRIPTION OF THE DRAWINGS

For a better understanding of the various described implementations, reference should be made to the Detailed Description below, in conjunction with the following drawings.

Like reference numerals refer to corresponding parts throughout the drawings and specification.

DETAILED DESCRIPTION

Reference will now be made in detail to various embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

A plurality of horizontally adjacent micro-lenses is disposed in an array above a respective pixel in a CMOS image sensor. ("Horizontally adjacent" is used herein to refer to adjacency in a plane parallel to the image-sensor surface. If the vertical direction, which is perpendicular to the image-sensor surface, is the z-direction, then horizontally adjacency may be in both the x- and y-directions.) For example, a respective plurality of horizontally adjacent micro-lenses is disposed in a respective array above each pixel in the image sensor, with one micro-lens array per pixel. Each micro-lens has a pitch size that is smaller than the pixel pitch size. The whole pixel may be covered by the same type of color filter (i.e., filters of the same color for the whole pixel). With this approach, a larger radius of curvature can be achieved for each individual micro-lens, which improves the ability of the micro-lens to focus light rays with large ray angles into the pixel.

Figure 4:
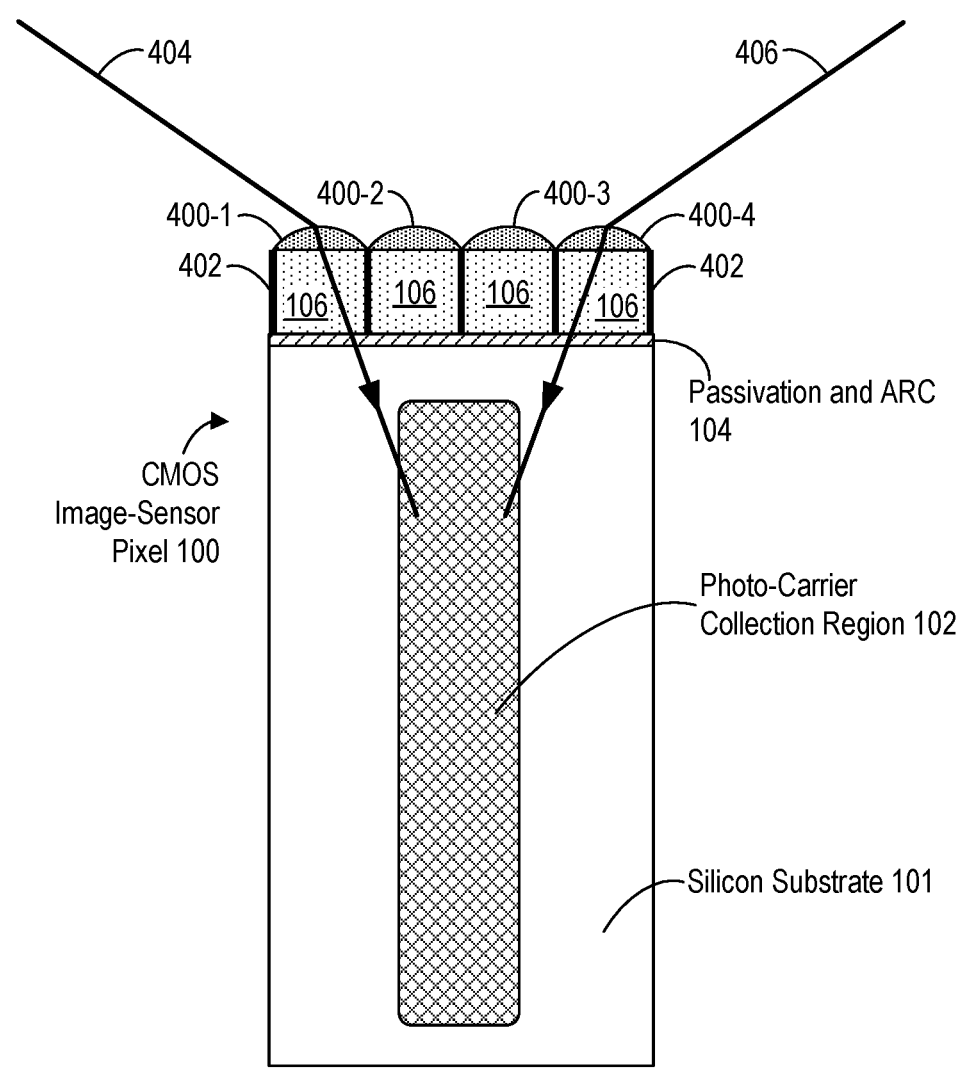
FIG. 4 is a cross-sectional view of a CMOS image-sensor pixel with a plurality of color filters and a plurality of micro-lenses situated above it, in accordance with some embodiments.

FIG. 4 is a cross-sectional view of a CMOS image-sensor pixel 100 with a plurality of color filters 106 and a plurality of micro-lenses 400 situated above it, in accordance with some embodiments. The pixel 100 includes a photo-carrier collection region 102 in a silicon substrate 101. Photo-carriers generated by light incident on a photodiode in the pixel 100 are collected in the photo-carrier collection region 102. Circuitry in the pixel 100 generates an output signal based on the amount of charge, and thus the number of photo-carriers, collected in the photo-carrier collection region 102. The photodiode and circuitry are not shown in FIG. 4, for simplicity. The pixel 100 is one of a plurality of pixels in a two-dimensional (2D) array of pixels in a CMOS image sensor.

The plurality of micro-lenses 400 situated above the pixel 100 composes a micro-lens array. The micro-lenses 400 of the micro-lens array are horizontally adjacent to each other (i.e., adjacent in a plane that is perpendicular to the page for FIG. 4 and parallel to the image-sensor surface). In the example of FIG. 4, the micro-lens array above the pixel 100 is a 4×4 micro-lens array, with four micro-lenses 400-1, 400-2, 400-3, and 400-4 visible in the cross-sectional view. In other example, the micro-lens array above the pixel 100 may be larger or smaller than this 4×4 micro-lens array, such that there are more or fewer micro-lenses 400 above the pixel 100 than in the example of FIG. 4. The micro-lenses 400 may have any of a variety of alternative shapes (e.g., oblong, hexagonal, octagonal, etc.). The micro-lens array focuses light into the photo-carrier collection region 102, with respective micro-lenses 400 focusing respective light rays into the photo-carrier collection region 102. For example, the micro-lens 400-1 focuses a light ray 404 into the photo-carrier collection region 102, and the micro-lens 400-4 focuses a light ray 406 into the photo-carrier collection region 102.

Respective pixels (e.g., each pixel) in a 2D array of pixels 100 may have respective micro-lens arrays situated above them (e.g., and aligned with them), such that a CMOS image sensor includes a plurality of micro-lens arrays, each of which is situated above a respective pixel of a plurality of pixels 100. Each micro-lens array of the plurality of micro-lens arrays includes a plurality of micro-lenses 400.

The plurality of color filters 106 situated above the pixel 100 composes a color-filter array. The color filters 106 of the color-filter array are horizontally adjacent to each other. The color-filter array is situated above the pixel 100 and below the corresponding micro-lens array (i.e., below the micro-lenses 400). The color-filter array is situated in a metal grid 402, which divides the color-filter array into the plurality of color filters 106. The color filters 106 are embedded in the metal grid 402 and therefore are embedded color filters. Embedded color filters reduce optical cross-talk, because light is reflected by the metal grid 402. The number of color filters 106 in the color-filter array equals the number of micro-lenses 400 in the micro-lens array. The color-filter array (i.e., the plurality of color filters 106) is separated from the pixel 100 by passivation and anti-reflective coating (ARC) 104. In some embodiments, the color filters 106 in the color-filter array for the pixel 100 are all of the same color: the plurality of color filters 106 situated above the pixel 100 composes an iso-color region. This color may be one color of a color scheme used in a CMOS image sensor (e.g., the Bayer color scheme, such that the color filters 106 above the pixel 100 are either all red, all green, or all blue). Alternatively, the plurality of color filters 106 in the color-filter array for the pixel 100 are of multiple colors (e.g., a first subset of the color filters 106 are of a first color and a second subset of the color filters 106 are of a second color). For example, a first subset of the color filters 106 have near-infrared (NIR) cut-off and a second subset of the color filters 106 do not have NIR cut-off. NIR is typically defined as light having wavelengths of 750-1400 nm.

Respective pixels (e.g., each pixel) in a 2D array of pixels 100 may have respective color-filters arrays situated above them (e.g., and aligned with them), such that a CMOS image sensor includes a plurality of color-filter arrays and a corresponding plurality of micro-lens arrays. Each color-filter array is situated above a respective CMOS pixel 100 and below a respective micro-lens array, and may be aligned with the respective CMOS pixel 100 and the respective micro-lens array. The plurality of color filters 106 of each color-filter array may be of the same color, while different color-filter arrays of the plurality of color-filter arrays are of different colors, in accordance with a color scheme. Alternatively, the plurality of color filters 106 of each color-filter array may include filters of multiple colors.

In some embodiments, instead of a color-filter array situated in the metal grid 402, a single color filter 106 is situated above the metal grid 402. In still other embodiments, the metal grid 402 is absent, and a single color filter 106 is situated between the micro-lens array and the passivation/ARC 104. In further other embodiments, the single color filters 106 are embedded within a metal grid that is used only on the borders of pixels (e.g., metal grid 108, FIG. 1). Respective pixels (e.g., each pixel) in a 2D array of pixels 100 may use any of these color-filter schemes. A CMOS image sensor thus may include a plurality of color filters, each situated above a respective CMOS pixel of the array of CMOS pixels and below a respective micro-lens array of the plurality of micro-lens arrays. The plurality of color filters may include color filters of different colors, in accordance with a color scheme.

Figure 5:
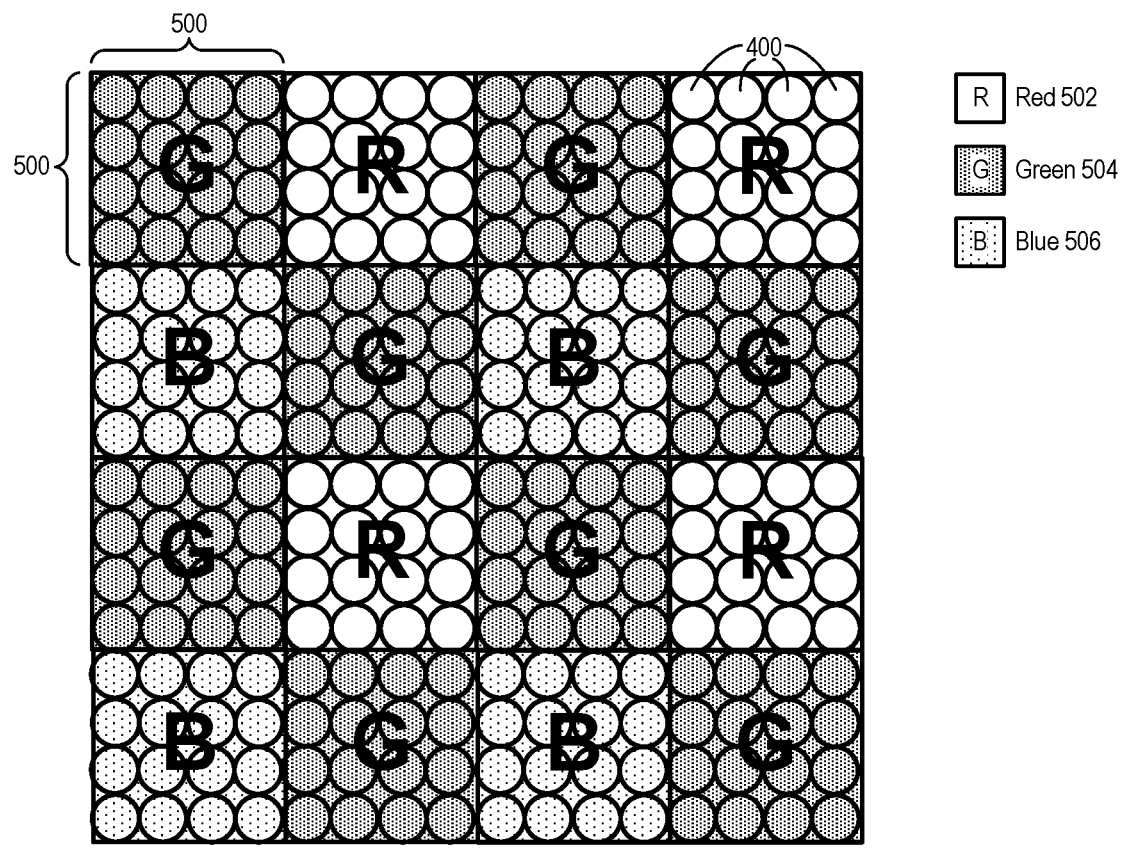
FIG. 5 is a plan view of pairs of micro-lens arrays and color-filter arrays situated above respective pixels, in accordance with some embodiments.

FIG. 5 is a plan view of pairs 500 of micro-lens arrays and color-filter arrays (or individual color filters), in accordance with some embodiments. Each pair 500 includes a micro-lens array and a corresponding color-filter array. Each pair 500 is situated above (e.g., and aligned with) a respective pixel 100. (The pixels 100 are not visible in FIG. 5 because they are obscured by the pairs 500.) The micro-lens arrays are arrays of horizontally adjacent micro-lenses 400 (i.e., adjacent within the plane of the page for FIG. 5). The color-filter arrays include red color-filter arrays 502 (i.e., arrays of horizontally adjacent red color filters 106), green color-filter arrays 504 (i.e., arrays of horizontally adjacent green color filters 106), and blue color-filter arrays 506 (i.e., arrays of horizontally adjacent blue color filters 106), in accordance with the Bayer color scheme. The pairs 500 are arranged in a grid, such that they effectively form a single large array of micro-lenses 400 and a single large array of color filters 106 above an array of pixels 100 in a CMOS image sensor.

Pixels 100 in an array of pixels (e.g., as shown in FIG. 5) have the same pitch (i.e., pitch size) as the micro-lens arrays and color-filter arrays. Micro-lenses 400 have a smaller pitch than the pitch of the pixels 100, micro-lens arrays, and color-filter arrays. The pitch of the plurality of micro-lenses within each micro-lens array (and also the pitch of the plurality of the plurality of color filters in each color-filter array) is thus smaller than the pitch of the pixels 100, micro-lens arrays, and color-filter arrays. In the example of FIGS. 4 and 5, which show micro-lens arrays that are 4×4 arrays of micro-lenses 400, the micro-lens 400 pitch is one-fourth the pitch of the pixels 100, micro-lens arrays, and color-filter arrays. For example, and without limitation, the architecture of FIGS. 4 and 5 can be applied to pixels 100 with pitch sizes of 2 um and above, with the pitch size of each micro-lens 400 being 0.5 um and above.

The micro-lenses in a particular micro-lens array may all have the same size, shape, and/or optical characteristics or may have different sizes, shapes, and or optical characteristics. For example, a first subset of micro-lenses in a particular micro-lens array may have a first size, first shape, and/or first optical characteristic(s), and a second subset of micro-lenses in the micro-lens array may have a distinct second size, second shape, and/or second optical characteristic(s).

In some embodiments, horizontally adjacent micro-lenses on the edges of a micro-lens array (and thus of a pixel region) may have different sizes (e.g., pitches; diameters), shapes, and/or optical characteristics than horizontally adjacent micro-lenses in the interior of the micro-lens array, to improve (e.g., optimize) the collection efficiency for incident light. Such micro-lens configurations may be used for a plurality of micro-lens arrays (e.g., all micro-lens arrays) in a CMOS image sensor, and thus in one or more (e.g., all) pixel regions of the CMOS image sensor.

Figure 6:
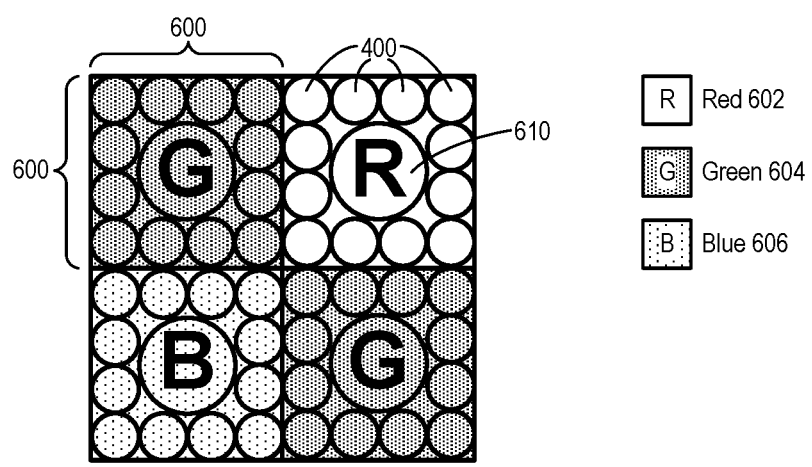
FIG. 6 is a plan view of pairs of micro-lens arrays and color-filter arrays situated above respective pixels, with each micro-lens array including micro-lenses of different sizes, in accordance with some embodiments.

FIG. 6 is a plan view of pairs 600 of micro-lens arrays and color-filter arrays (or individual color filters) situated above respective pixels, with each micro-lens array including micro-lenses of different sizes, in accordance with some embodiments. Each pair 600 includes a micro-lens array and a corresponding color-filter array. Each pair 600 is situated above (e.g., and aligned with) a respective pixel 100. (The pixels 100 are not visible in FIG. 6 because they are obscured by the pairs 600.) The micro-lens arrays have multiple horizontally adjacent micro-lenses 400 along their edges (i.e., immediately adjacent to the edges of the arrays) and single central micro-lenses 610 in their interiors. The multiple micro-lenses 400 in each array are horizontally adjacent to the central micro-lens 610 in the array. The central micro-lenses 610 are larger than the edge micro-lenses 400; in the example of FIG. 6, the central micro-lenses 610 have twice the diameter of the edge micro-lenses 400. In other examples, respective (e.g., all) micro-lens arrays have multiple micro-lenses in their interiors that are larger than their edge micro-lenses.

Figure 7:
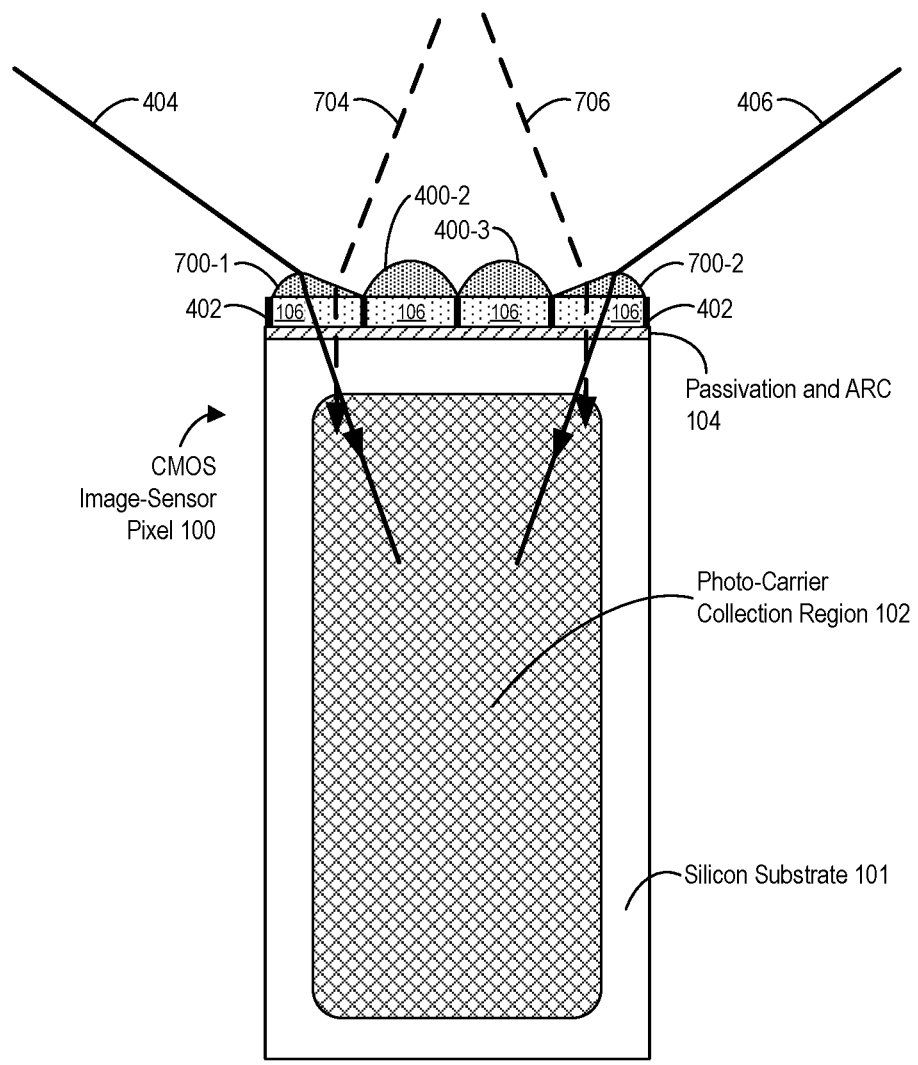
FIG. 7 is a cross-sectional view of a pixel with a plurality of color filters and a plurality of micro-lenses situated above it, wherein the micro-lenses have different shapes, in accordance with some embodiments.

FIG. 7 is a cross-sectional view of a pixel 100 with a plurality of color filters 106 and a plurality of horizontally adjacent micro-lenses 400 and 700 situated above it, wherein the micro-lenses 400 and 700 have different shapes, in accordance with some embodiments. The plurality of horizontally adjacent color filters 106 and the plurality of horizontally adjacent micro-lenses 400 and 700 compose a respective micro-lens array and color-filter array. (The color-filter array may be replaced with a single color filter.) The micro-lenses 400 (e.g., micro-lenses 400-2 and 400-3), which are in the interior of the micro-lens array (i.e., are central micro-lenses), are symmetrical. The micro-lenses 700 (e.g., micro-lenses 700-1 and 700-2), which are along edges of the micro-lens array (i.e., are edge micro-lenses), are asymmetrical. The micro-lenses 400 and 700 may have the same pitch. The asymmetry of the micro-lenses 700-1 and 700-2 allows the underlying pixel 100 to capture light rays 704 and 706 as well as light rays 404 and 406. The asymmetry may be calculated from the F-number of the micro-lens 700-1 or 700-2, the size of the photo-carrier collection region 102, and the distance from the active surface of the pixel 100 to the micro-lens 700-1 or 700-2. The shape and asymmetry of the micro-lenses 700-1 and 700-2 may be different for different pixels 100, to improve (e.g., optimize) light collection for the pixels. In the absence of the asymmetry of the micro-lenses 700-1 and 700-2, the light rays 404 and 406 would not be focused into the photo-carrier collection region 102. The light rays 404 and 406 thus may not be collected in the pixel 100 and might lead to cross-talk in adjacent pixels. The structure of FIG. 7 thus improves collection efficiency and reduces cross-talk. Respective pairs of the micro-lens array and color-filter array of FIG. 7 may be disposed above respective pixels 100 in a pixel array of a CMOS image sensor.

In some embodiments, the asymmetric edge micro-lenses 700 (FIG. 7) may be combined with one or more larger, symmetric central micro-lenses (e.g., with micro-lens 610, FIG. 6) in a micro-lens array. Color filters 106 in an associated color-filter array situated below the micro-lens array and above a pixel 100 may be sized accordingly.

Figure 8:
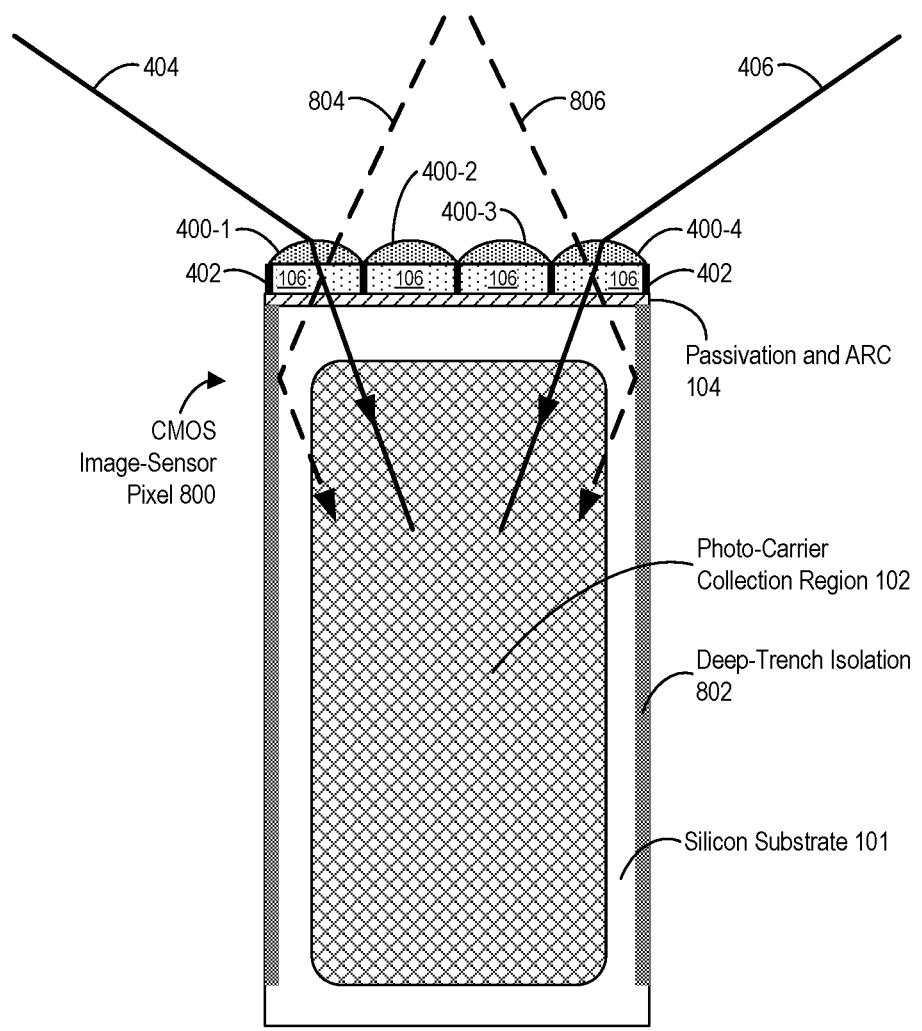
FIG. 8 is a cross-sectional view of a pixel with a plurality of color filters and a plurality of micro-lenses situated above it, in which deep-trench isolation is situated along sides of the pixel, in accordance with some embodiments.

In some embodiments, deep-trench isolation is used to improve collection efficiency and reduce cross-talk. (The term "deep-trench isolation," or "DTI" for short, is a standard, well-known technical term.) FIG. 8 is a cross-sectional view of a pixel 800 with a plurality of horizontally adjacent color filters 106 (i.e., a color-filter array with color filters 106) and a plurality of horizontally adjacent micro-lenses 400 (i.e., a micro-lens array with micro-lenses 400) situated above it, in which deep-trench isolation 802 is situated along sides of the pixel 800, in accordance with some embodiments. (The plurality of color filters may be replaced with a single color filter.) The deep-trench isolation 802 may extend along sides of the photo-carrier collection region 102 but be separated from the photo-carrier collection region 102 by regions of the silicon substrate 101. The deep-trench isolation 802 is shown in FIG. 8 as backside deep-trench isolation that extends into the silicon substrate 101 from the backside of the silicon substrate 101. (The backside is shown on top in FIG. 8.) Alternatively, frontside deep-trench isolation that extends into the silicon substrate 101 from the frontside of the silicon substrate 101 is used. The micro-lenses 400 situated above the pixel 800 may be symmetrical.

The deep-trench isolation 802 reflects light into the photo-carrier collection region 102. For example, light rays 804 and 806 are reflected into the photo-carrier collection region 102 by the deep-trench isolation 802 after not being focused into the photo-carrier collection region 102 by respective micro-lenses 400-1 and 400-4. Deep-trench isolation 802 thus improves collection efficiency and reduces cross-talk.

Respective pairs of the micro-lens array and color-filter array of FIG. 8 may be disposed above respective pixels 800 in a pixel array of a CMOS image sensor. The deep-trench isolation 802 may be combined with both asymmetric and symmetric micro-lenses (e.g., the asymmetric micro-lenses 700 and symmetric micro-lenses 400, FIG. 7) and/or with various-sized micro-lenses (e.g., the various-sized micro-lenses 400 and 610, FIG. 6).

Figure 1:
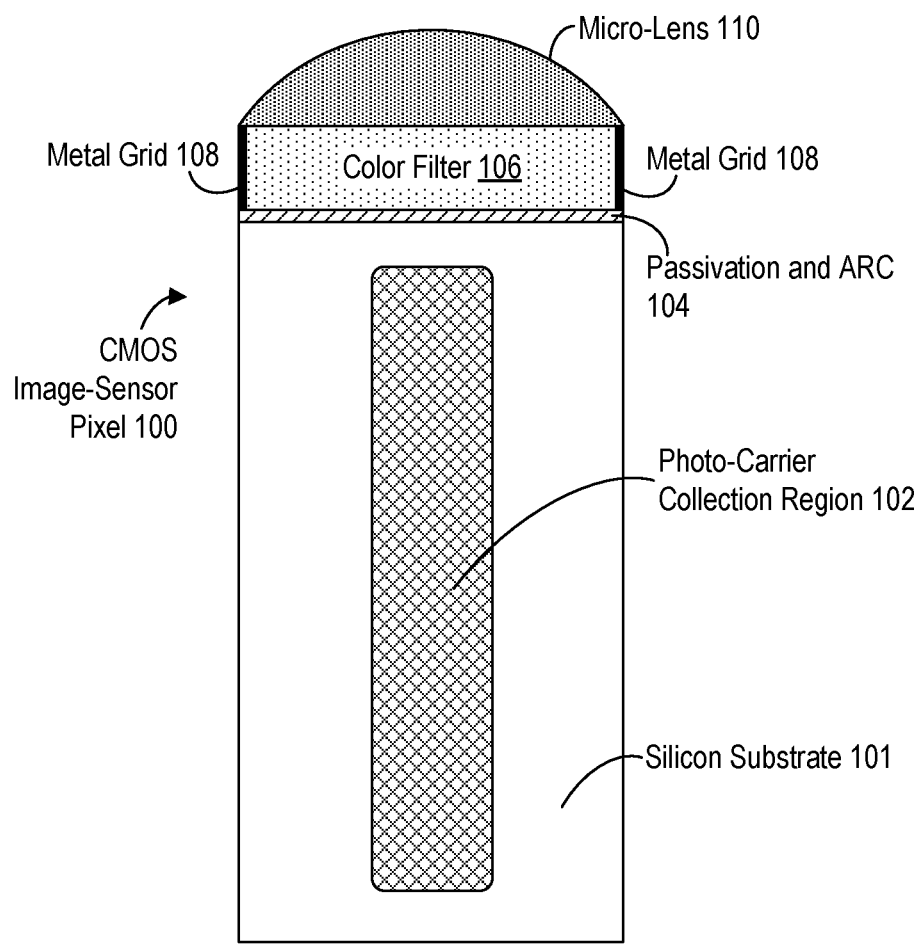
FIG. 1 is a cross-sectional view of a CMOS image-sensor pixel with a single micro-lens.
Figure 2:
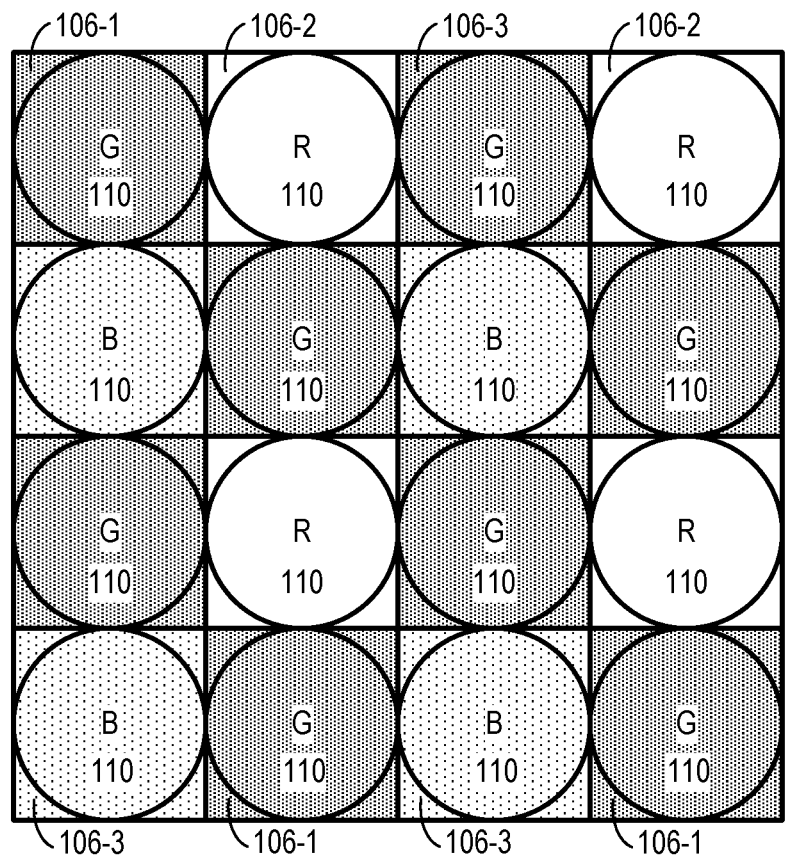
FIG. 2 is a plan view of a plurality of micro-lenses and color filters, which are situated above respective CMOS image-sensor pixels.
Figure 3:
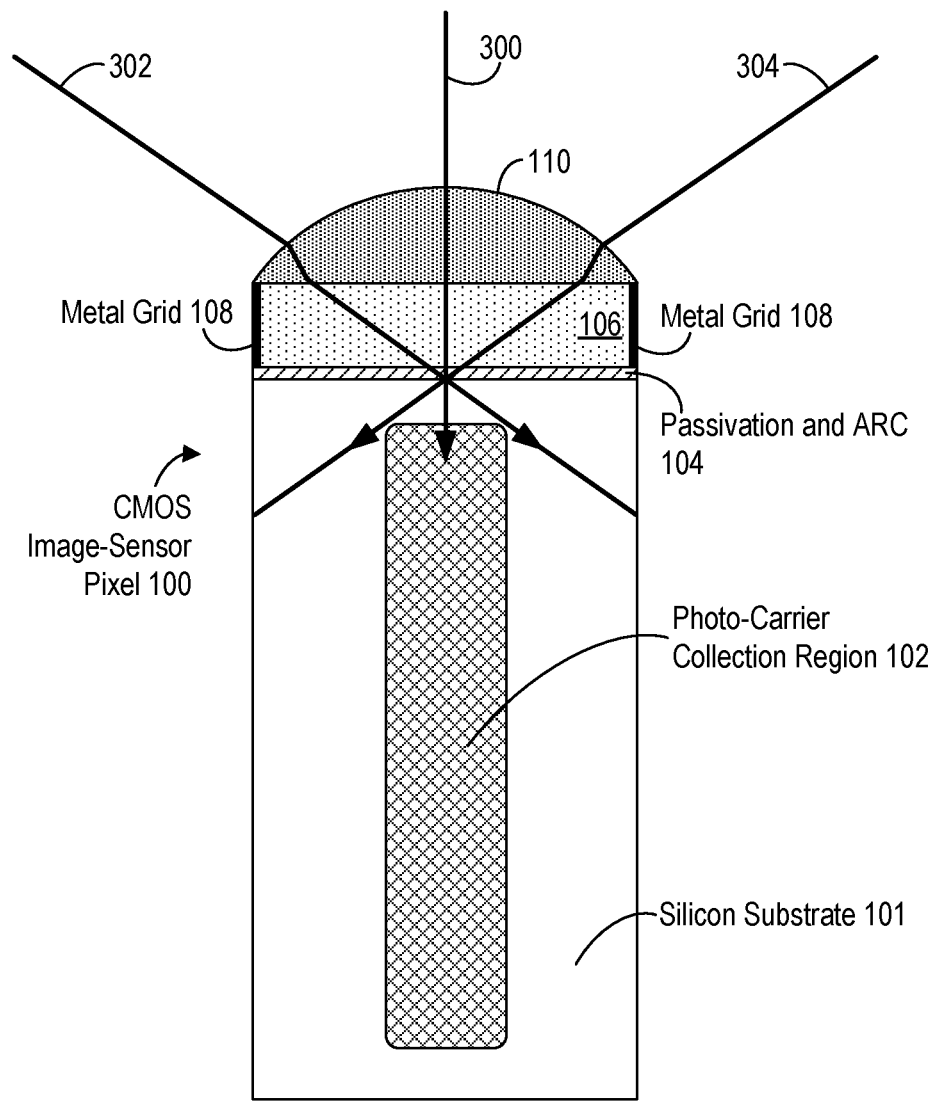
FIG. 3 shows the cross-sectional view of FIG. 1 along with incident light of various chief ray angles.
Figure 9:
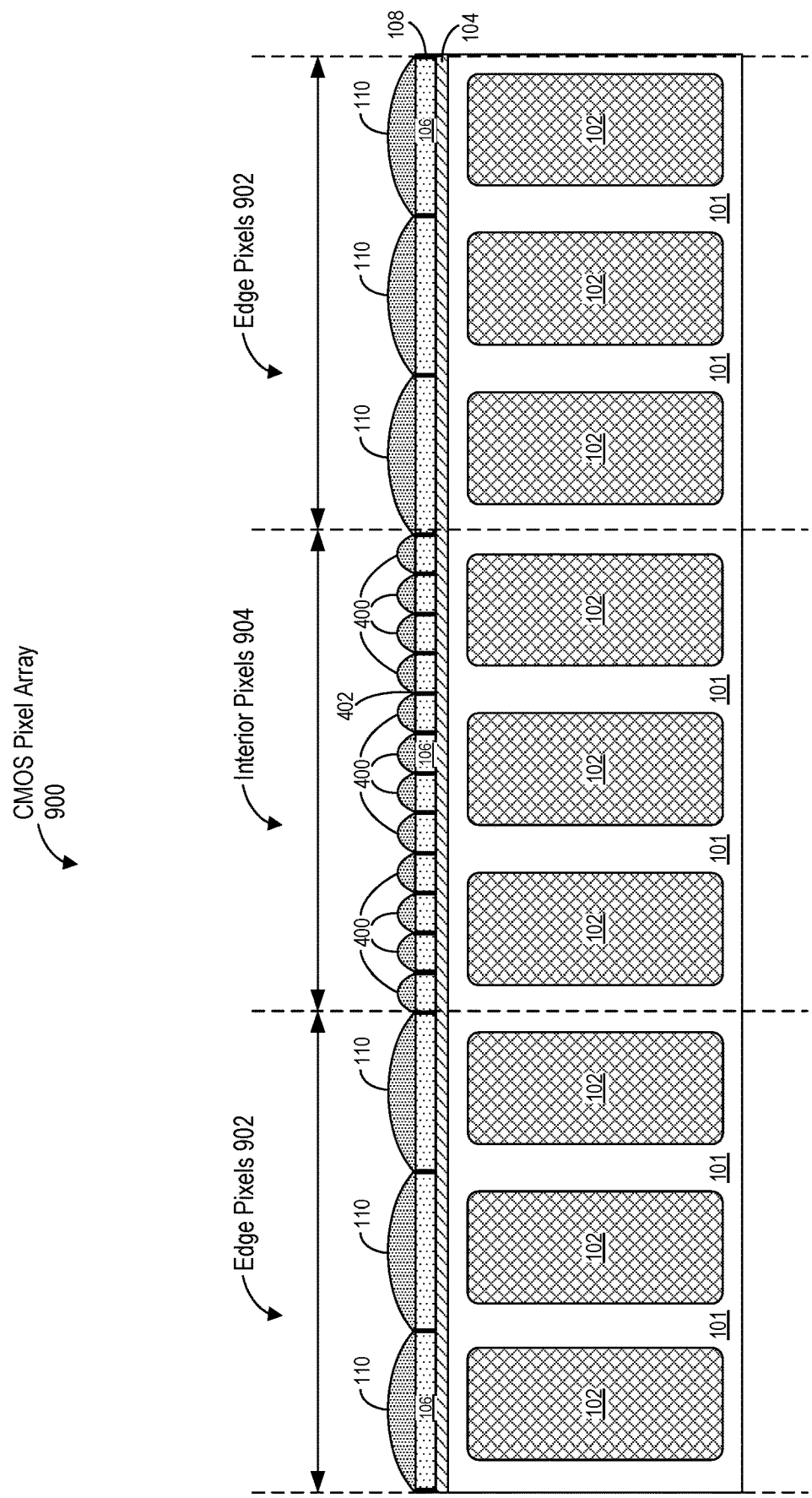
FIG. 9 is a cross-sectional view of a CMOS pixel array with edge pixels and interior pixels, in which the micro-lenses for the edge pixels differ from the micro-lenses for the interior pixels, in accordance with some embodiments.

A CMOS image sensor includes an array of pixels (e.g., pixels 100 and/or 800). The micro-lenses for pixels along edges of the pixel array may differ from the micro-lenses for pixels in the interior of the pixel array. FIG. 9 is a cross-sectional view of a CMOS pixel array 900 with edge pixels 902 and interior pixels 904, in accordance with some embodiments. The edge pixels 902 (e.g., pixels 100 and/or 800) may be defined as pixels within a specified number of pixel rows and/or pixel columns from edges of the array 900; such pixels are considered to be along edges of the array 900. The interior pixels 904 (e.g., pixels 100 and/or 800) may be defined as pixels that are more than the specified number of pixel rows and/or pixel columns from edges of the array 900. In the example of FIG. 9, the specified number is three; in general, the specified number may vary between different arrays 900. The interior pixels 904 have respective micro-lens arrays (and corresponding respective color-filter arrays) situated above them. The micro-lens arrays may be arrays of horizontally adjacent micro-lenses 400 (as shown in FIG. 9) and/or arrays of micro-lenses of differing sizes, shapes, and/or optical characteristics (e.g., as shown in FIGS. 6 and 7). The edge pixels 902 have single respective per-pixel micro-lenses 110 (e.g., as shown in FIG. 1) situated above them. The per-pixel micro-lenses 110 are horizontally adjacent. The edge pixels 902 and/or interior pixels 904 may include deep-trench isolation (e.g., deep-trench isolation 802, FIG. 8).

In some embodiments, the micro-lens arrays above respective pixels are horizontally offset with respect to the pixels, to improve optical collection.

Figure 10:
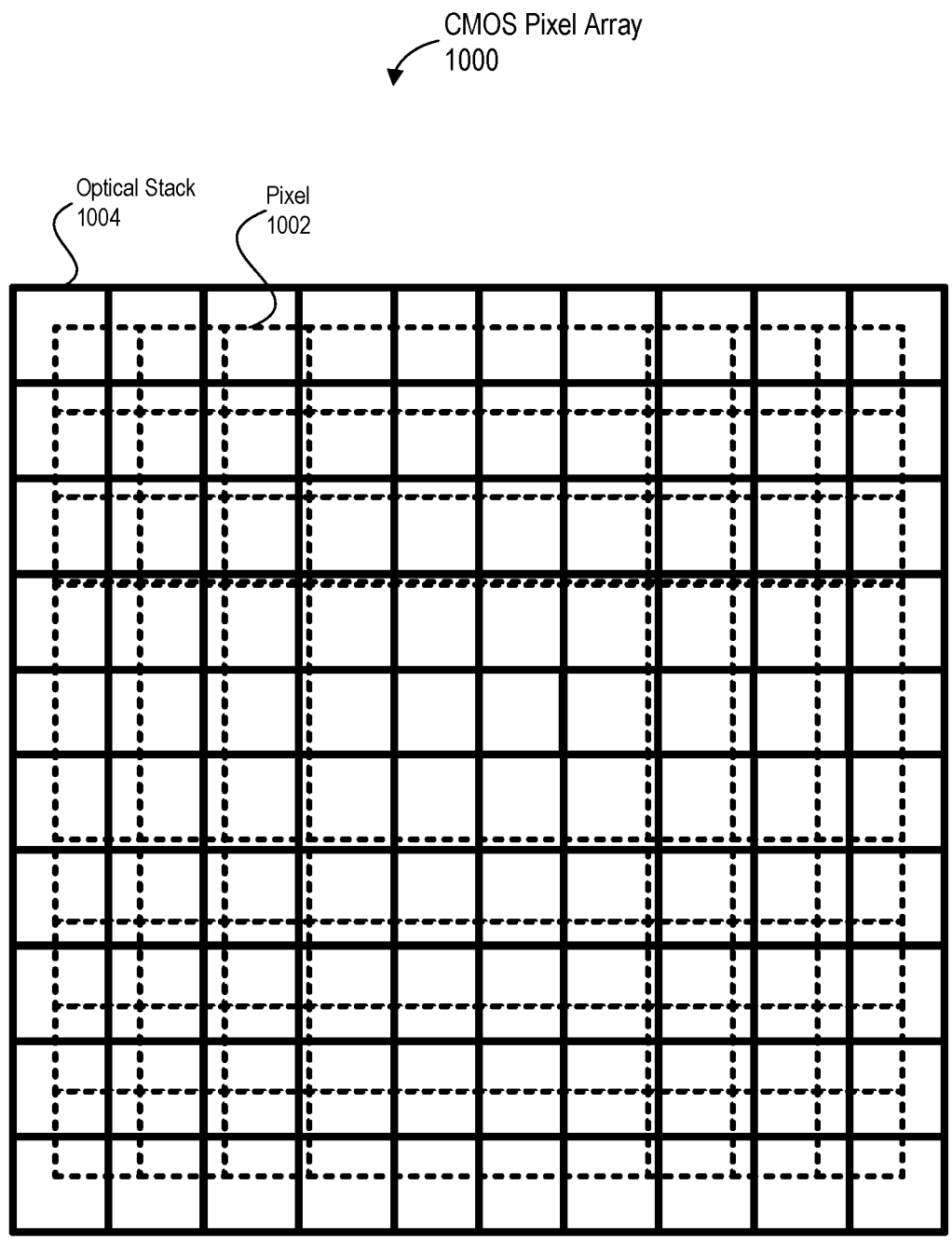
FIG. 10 is a plan view of a CMOS pixel array of pixels with corresponding optical stacks that have varying degrees of horizontal offset with respect to the pixels, in accordance with some embodiments.

FIG. 10 is a plan view of a CMOS pixel array 1000 of pixels 1002 (e.g., pixels 100 and/or 800) with corresponding optical stacks 1004 that have varying degrees of horizontal offset with respect to the pixels 1002, in accordance with some embodiments. (Horizontal offset in FIG. 10 is in the plane of the page, which is parallel to the image-sensor surface. If this plane is the x-y plane, the horizontal offset may be in the x-direction and/or in the y-direction. Pixels 1002 are indicated by dashed squares, while optical stacks 1004 are indicated by solid-line squares.) Each optical stack 1004 includes a respective micro-lens array (e.g., as shown in any of FIGS. 4-8 or combination thereof). A respective optical stack 1004 (e.g., each optical stack 1004) may also include a color-filter array and a metal grid 402 (e.g., as shown in FIG. 4, 7, or 8). In some embodiments, the metal grid 402 is absent from a respective (e.g., each) optical stack 1004. In some embodiments, a respective (e.g., each) optical stack 1004 includes a single color filter 106 instead of a color-filter array. Optical stacks 1004 in the center of the CMOS pixel array 1000 are effectively aligned with (i.e., centered above) their respective pixels 1002. Optical stacks 1004 located closer to edges of the CMOS pixel array 1000 have increasing degrees of horizontal offset from their underlying respective pixels 1002: the degrees of horizontal offset increase with increasing proximity of the optical stacks 1004 to edges of the CMOS pixel array 1000. The horizontal offsets of the optical stacks 1004 are toward the edges (i.e., toward the closest edge) of the CMOS pixel array 1000.

Figure 11:
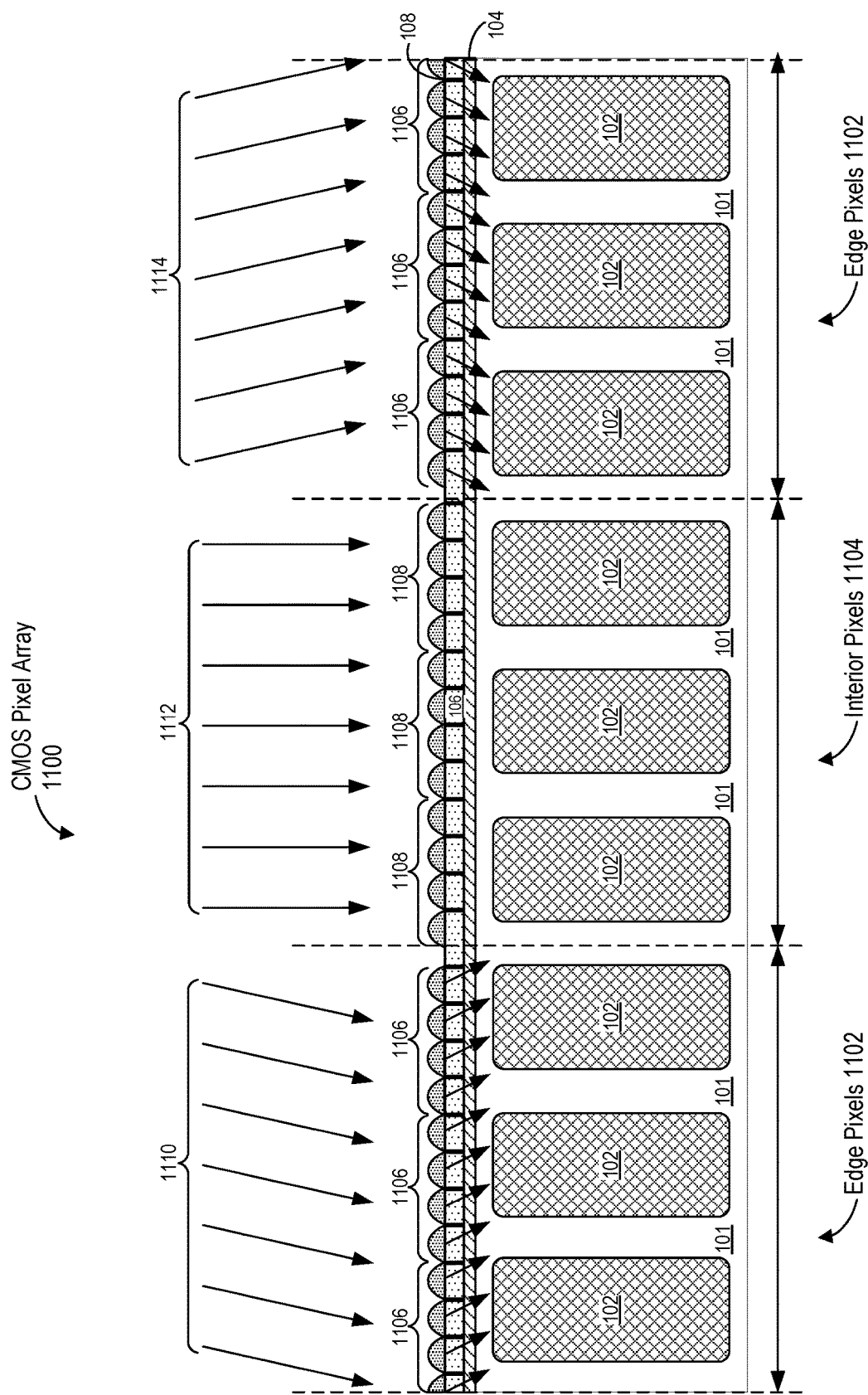
FIG. 11 is a cross-sectional view of a CMOS pixel array with edge pixels and interior pixels, wherein micro-lens arrays for the edge pixels are horizontally offset with respect to the edge pixels, in accordance with some embodiments.

FIG. 11 is a cross-sectional view of a CMOS pixel array 1100 with edge pixels 1102 and interior pixels 1104, in accordance with some embodiments. The edge pixels 1102 may be defined as pixels (e.g., pixels 100 and/or 800) within a specified number of pixel rows and/or pixel columns from edges of the CMOS pixel array 1100; such pixels are considered to be along edges of the array 1100. The interior pixels 1104 (e.g., pixels 100 and/or 800) may be defined as pixels that are more than the specified number of pixel rows and/or pixel columns from edges of the array CMOS pixel 1100. In the example of FIG. 11, the specified number is three; in general, the specified number may vary between different arrays 1100. The interior pixels 1104 have respective interior micro-lens arrays 1108 of horizontally adjacent micro-lenses aligned with them: the micro-lens arrays 1108 are centered over respective interior pixels 1104. In some embodiments, the interior pixels 1104 also have respective color-filter arrays (i.e., arrays of horizontally adjacent color filters 106) aligned with them. Alternatively, the interior pixels 1104 may have respective single color filters 106 aligned with them. The edge pixels 1102 have respective edge micro-lens arrays 1106 of horizontally adjacent micro-lenses that are horizontally offset from them. The horizontal offsets are toward the closest edge of the CMOS pixel array 1100. In some embodiments, the edge pixels 1102 also have respective color-filter arrays (i.e., arrays of horizontally adjacent color filters 106) that are horizontally offset from them, with the same offset as the micro-lens arrays 1106. Alternatively, the edge pixels 1102 may have respective single color filters 106 that are horizontally offset from them, with the same offset as the micro-lens arrays 1106. Optical stacks for the interior pixels 1104 are thus aligned with the interior pixels 1104, while optical stacks for the edge pixels 1102 are horizontally offset from the edge pixels 1102, toward the closest edge of the CMOS pixel array 1100. The aligned interior micro-lens arrays 1108 provide proper collection of incident light 1112, while the offset edge micro-lens arrays 1106 provide improved collection of incident light 1110 and 1114.

Figure 12:
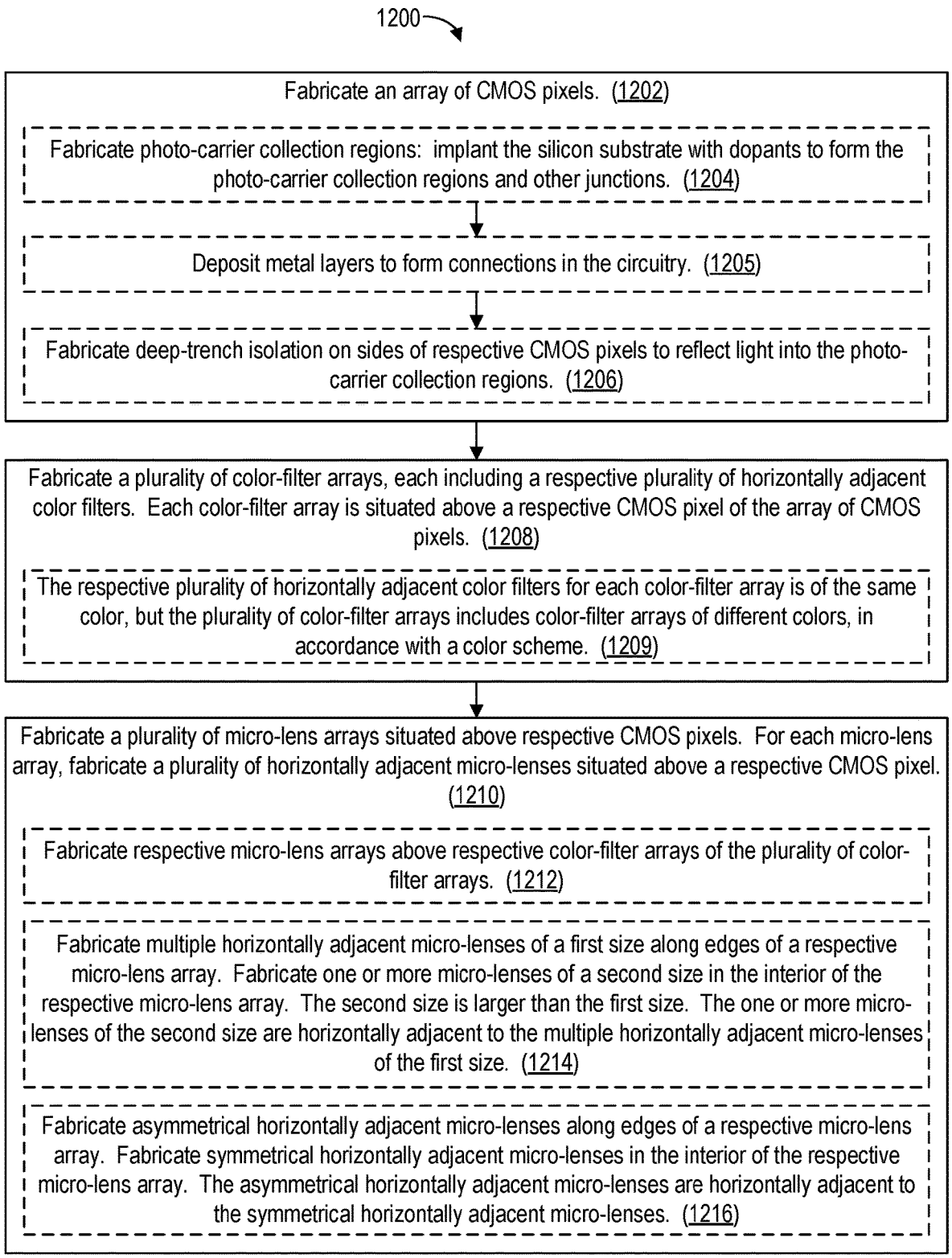
FIG. 12 is a flowchart showing a method of fabricating an image sensor in accordance with some embodiments.

FIG. 12 is a flowchart showing a method 1200 of fabricating a CMOS image sensor, in accordance with some embodiments. In the method 1200, an array of CMOS pixels (e.g., pixels 100, FIGS. 4 and/or 7, and/or 800, FIG. 8) is fabricated (1202). Fabricating the array of CMOS pixels includes fabricating (1204) photo-carrier collection regions 102: a silicon substrate (e.g., silicon substrate 101, FIGS. 4, 7, 8, 9, and/or 11) is implanted with dopants to form the photo-carrier collection regions and other junctions in the image sensor. Metal layers are deposited (1205) to form connections in the image-sensor circuitry. In some embodiments, deep-trench isolation (e.g., DTI 802, FIG. 8) is fabricated (1206) on sides of respective CMOS pixels to reflect light into the photo-carrier collection regions 102.

In some embodiments, a plurality of color-filter arrays (e.g., arrays 502, 504, and 506, FIG. 5; arrays 602, 604, and 606, FIG. 6) is fabricated (1208), each including a respective plurality of horizontally adjacent color filters. Each color-filter array is situated above a respective CMOS pixel of the array of CMOS pixels. The respective plurality of color filters for each color-filter array may be of the same color (1209), but the plurality of color-filter arrays includes color-filter arrays of different colors, in accordance with a color scheme (e.g., the Bayer color scheme).

A plurality of micro-lens arrays (e.g., as shown in any of FIGS. 4-9 or a combination thereof) is fabricated (1210) above respective CMOS pixels. For each micro-lens array, a plurality of horizontally adjacent micro-lenses situated above a respective CMOS pixel is fabricated. In some embodiments, respective micro-lens arrays are fabricated (1212) above respective color-filter arrays of the plurality of color-filter arrays (e.g., as shown for pair 500, FIG. 5; pairs 600, FIG. 6).

In some embodiments, multiple horizontally adjacent micro-lenses of a first size (e.g., micro-lenses 400, FIG. 6) are fabricated (1214) along edges of a respective micro-lens array. One or more micro-lenses of a second size (e.g., micro-lenses 610, FIG. 6) are fabricated (1214) in the interior of the respective micro-lens array. The second size is larger than the first size. The one or more micro-lenses of the second size are horizontally adjacent to the multiple horizontally adjacent micro-lenses of the first size.

In some embodiments, asymmetrical horizontally adjacent micro-lenses (e.g., micro-lenses 700, FIG. 7) are fabricated (1216) along edges of a respective micro-lens array. Symmetrical horizontally adjacent micro-lenses (e.g., micro-lenses 400, FIG. 7) are fabricated (1216) in the interior of the respective micro-lens array. The asymmetrical horizontally adjacent micro-lenses are horizontally adjacent to the symmetrical horizontally adjacent micro-lenses.

In some embodiments (e.g., that include step 1206), fabricating (1210) the plurality of micro-lens arrays includes, for respective micro-lens arrays situated above respective CMOS pixels that include the photo-carrier collection regions and the deep-trench isolation, fabricating the plurality of horizontally adjacent micro-lenses to be symmetrical (e.g., per FIGS. 4 and/or 8).

In some embodiments, the plurality of micro-lens arrays fabricated in step 1210 is fabricated above CMOS pixels in the interior of the array of CMOS pixels, and the method 1200 further includes fabricating per-pixel micro-lenses above CMOS pixels along edges of the array of CMOS pixels (e.g., per FIG. 9).

In some embodiments, the plurality of micro-lens arrays fabricated in step 1210 includes micro-lens arrays that are horizontally offset with respect to their pixels (e.g., per FIG. 10 or 11).

CMOS image sensors as fabricated in accordance with the method 1200 provide reduced optical cross-talk, improved optical collection, and robust imaging for a wide range of incident chief ray angles.

The foregoing description, for purpose of explanation, has been described with reference to specific embodiments. However, the illustrative discussions above are not intended to be exhaustive or to limit the scope of the claims to the precise forms disclosed. Many modifications and variations are possible in view of the above teachings. The embodiments were chosen in order to best explain the principles underlying the claims and their practical applications, to thereby enable others skilled in the art to best use the embodiments with various modifications as are suited to the particular uses contemplated.

What is claimed is:

1. An image sensor, comprising:
   an array of CMOS pixels;
   a plurality of micro-lens arrays disposed on a planar surface above the array of CMOS pixels, wherein:
      each micro-lens array of the plurality of micro-lens arrays comprises a plurality of horizontally adjacent micro-lenses, and
      each micro-lens array of the plurality of micro-lens arrays is situated above a respective CMOS pixel in an interior region of the array of CMOS pixels; and
   a plurality of per-pixel micro-lenses disposed on the planar surface and situated above respective CMOS pixels in an edge region of the array of CMOS pixels such that there is only one per-pixel micro-lens situated above each CMOS pixel in the edge region.

2. The image sensor of claim 1, wherein:
   the CMOS pixels in the array of CMOS pixels have a first pitch;
   the micro-lens arrays in the plurality of micro-lens arrays have the first pitch; and
   the plurality of horizontally adjacent micro-lenses within each micro-lens array of the plurality of micro-lens arrays have a second pitch that is smaller than the first pitch.

3. The image sensor of claim 1 further comprising a plurality of color-filter arrays, wherein each color-filter array of the plurality of color-filter arrays (i) is situated above a respective CMOS pixel in the interior region of the array of CMOS pixels and below a respective micro-lens array of the plurality of micro-lens arrays and (ii) comprises a respective plurality of horizontally adjacent color filters.

4. The image sensor of claim 3, wherein:
   the respective plurality of color filters for each color-filter array is of the same color, and the plurality of color-filter arrays comprises color-filter arrays of different colors, in accordance with a color scheme.

5. The image sensor of claim 4, wherein the color scheme is the Bayer color scheme, the different colors being red, green, and blue.

6. The image sensor of claim 3, further comprising passivation and anti-reflective coating situated above the array of CMOS pixels and below the plurality of color-filter arrays.

7. The image sensor of claim 3, further comprising a metal grid to divide each color-filter array of the plurality of color-filter arrays into the plurality of horizontally adjacent color filters, the metal grid being situated above the array of CMOS pixels and below the plurality of micro-lens arrays.

8. The image sensor of claim 1, wherein respective micro-lens arrays of the plurality of micro-lens arrays comprise four-by-four arrays of micro-lenses.

9. The image sensor of claim 1, wherein a respective micro-lens array of the plurality of micro-lens arrays comprises:
multiple horizontally adjacent micro-lenses of a first size along edges of the micro-lens array; and
one or more micro-lenses of a second size in the interior of the micro-lens array, wherein the second size is larger than the first size and the one or more micro-lenses of the second size are horizontally adjacent to the multiple horizontally adjacent micro-lenses of the first size.

10. The image sensor of claim 1, wherein a respective micro-lens array of the plurality of micro-lens arrays comprises:
asymmetrical horizontally adjacent micro-lenses along edges of the micro-lens array; and
symmetrical horizontally adjacent micro-lenses in the interior of the micro-lens array,
wherein the asymmetrical horizontally adjacent micro-lenses are horizontally adjacent to the symmetrical horizontally adjacent micro-lenses.

11. The image sensor of claim 1, wherein respective CMOS pixels in the array of CMOS pixels each comprise:
a photo-carrier collection region; and
deep-trench isolation on sides of the CMOS pixel to reflect light into the photo-carrier collection region.

12. The image sensor of claim 11, wherein, in a micro-lens array situated above a respective CMOS pixel that includes the photo-carrier collection region and the deep-trench isolation, the plurality of horizontally adjacent micro-lenses are symmetrical.

13. The image sensor of claim 1, wherein the edge region of the array of CMOS pixels encloses the interior region of the array of CMOS pixels.

14. The image sensor of claim 1, wherein a first micro-lens array of the plurality of micro-lens arrays is situated above a first pixel in the array of CMOS pixels and is offset horizontally from the first pixel.

15. The image sensor of claim 1, wherein respective micro-lens arrays of the plurality of micro-lens arrays have respective, varying degrees of horizontal offset from respective pixels in the array of CMOS pixels.

16. The image sensor of claim 1, wherein the interior region includes pixels that are more than a predetermined number of pixels from an outside edge of the array of CMOS pixels, and the edge region includes pixels that are less than the predetermined number of pixels from the outside edge of the array of CMOS pixels.

* * * * *